(12) United States Patent
Yamazaki

(10) Patent No.: US 7,847,797 B2
(45) Date of Patent: Dec. 7, 2010

(54) DRIVE CIRCUIT AND DRIVE DEVICE FOR LIQUID CRYSTAL DISPLAY

(75) Inventor: Koji Yamazaki, Ibaraki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 776 days.

(21) Appl. No.: 11/837,589

(22) Filed: Aug. 13, 2007

(65) Prior Publication Data

US 2009/0073152 A1    Mar. 19, 2009

(30) Foreign Application Priority Data

Aug. 16, 2006    (JP)    .............................. 2006-221854

(51) Int. Cl.
*G09G 5/00*    (2006.01)
(52) U.S. Cl. ...................... 345/211; 345/100
(58) Field of Classification Search ........... 345/87–104, 345/204, 211
See application file for complete search history.

(56) References Cited

U.S. PATENT DOCUMENTS 6,483,384 B1 * 11/2002 Chimura .................... 330/257
7,075,342 B2 * 7/2006 Nishimura ................... 327/108
7,352,314 B2 * 4/2008 Horibata ..................... 341/150

FOREIGN PATENT DOCUMENTS

JP    05-041651    2/1993
JP    2003-122325    4/2003

* cited by examiner

*Primary Examiner*—Jimmy H Nguyen
(74) *Attorney, Agent, or Firm*—Volentine & Whitt, PLLC

(57) ABSTRACT

The present invention provides a drive circuit suitable for use in a liquid crystal display, comprising an op amp which has an inversion input, a non-inversion input and a first output and of which the inversion input and the first output are connected to each other; a first PMOS transistor having a gate to which a node for the non-inversion input of the op amp is connected, and a source to which a node for the output of the op amp is connected; a first NMOS transistor having a gate to which a drain of the first PMOS transistor is connected, a drain to which the node for the output of the op amp is connected, and a source connected to ground; and a second NMOS transistor having a gate supplied with a predetermined first voltage, a drain to which the drain of the first PMOS transistor is connected, and a source connected to ground.

10 Claims, 9 Drawing Sheets

US 7,847,797 B2

DRIVE CIRCUIT AND DRIVE DEVICE FOR LIQUID CRYSTAL DISPLAY

BACKGROUND OF THE INVENTION

The present invention relates to a drive circuit and a drive device both suitable for use in a liquid crystal display or the like. The present invention relates particularly to a source driver of a liquid crystal display, having a large number of output op amps.

With upsizing of a recent liquid crystal display, there has been a demand for improvements in various performance of the liquid crystal display. In particular, the load capacity of a data line also increases with the upsizing of the liquid crystal display, and an improvement in the drive capacity of the liquid crystal display has been expected. Competition has heated up in recent years in the market of the liquid crystal display, and hence respective mounting parts have been forced to cut cost down. A drive device is also similar to the above. There has thus been a demand for one that has high drive capacity and is low in cost.

In a patent document 1 (Japanese Unexamined Patent Publication No. Hei 5(1993)-041651), a comparator makes a comparison of difference between input and output signals of an output op amp. Only when the input signal is lower greater than or equal to a predetermined threshold voltage than the output signal, an enable signal is outputted from the comparator to turn on a switching transistor thereby to make a large current source effective, thus making it possible to vary an output current on the discharge side of a load capacitance, whereby power consumption of a device is suppressed. In a patent document 2 (Japanese Unexamined Patent Publication No. 2003-122325), a plurality of charge/discharge paths are provided to improve a through rate.

In the above patent document 1, however, the operation is no different from the conventional output until a constant threshold value is reached, although the discharge can be done quickly when the input signal is low greater than or equal to the threshold voltage. When the range of an output voltage is wide, effectiveness becomes very low. Further, the charging operation is not set up speedily. Although the above patent document 2 has a charging operation and a discharging operation, there is a need to control their separate paths by some separate signals, thus resulting in an increase in control circuit. Even though a transistor is simply turned on/off to perform control, a transistor appropriate to a large current cannot be expected to have a quick response, thereby causing difficulty in control.

SUMMARY OF THE INVENTION

The present invention has been made in view of the foregoing. It is an object of the present invention to provide a drive circuit suitable for use in a liquid crystal display, which is low in cost and has high drive capacity.

According to one aspect of the present invention, for attaining the above object, there is provided a drive circuit suitable for use in a liquid crystal display, comprising an op amp which has an inversion input, a non-inversion input and a first output and of which the inversion input and the first output are connected to each other; a first PMOS transistor having a gate to which a node for the non-inversion input of the op amp is connected, and a source to which a node for the output of the op amp is connected; a first NMOS transistor having a gate to which a drain of the first PMOS transistor is connected, a drain to which the node for the output of the op amp is connected, and a source connected to ground; and a second NMOS transistor having a gate supplied with a predetermined first voltage, a drain to which the drain of the first PMOS transistor is connected, and a source connected to ground.

Adopting the configuration of the drive circuit of the present invention, which is suitable for use in the liquid crystal display makes it possible to provide a drive circuit of a liquid crystal display, which is low in cost and has high drive capacity.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
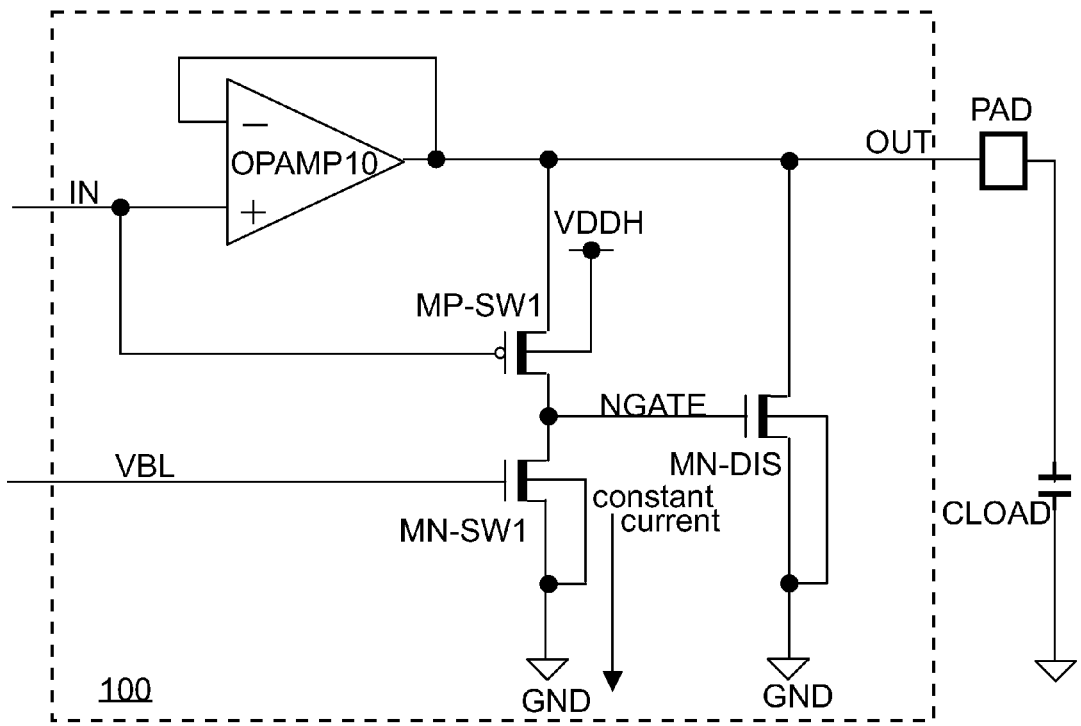
FIG. 1 shows a drive circuit according to a first embodiment of the present invention.

Preferred embodiments of the present invention will hereinafter be described in detail with reference to the accompanying drawings. In the following description and accompanying drawings, constituent elements having substantially the same functions and configurations are respectively given the same reference numerals, and their dual explanations will therefore be omitted.

First Preferred Embodiment

Figure 2:
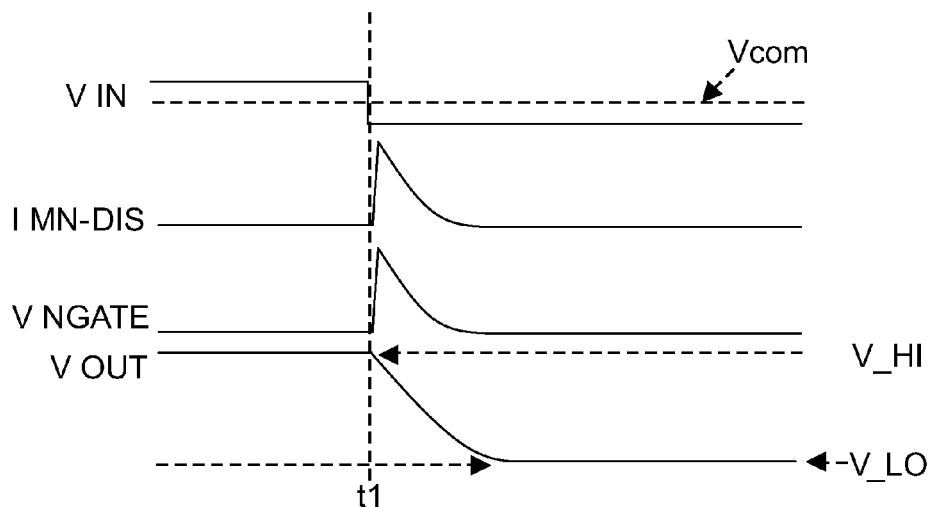
FIG. 2 is a timing chart of the drive circuit shown in FIG. 1.
Figure 9:
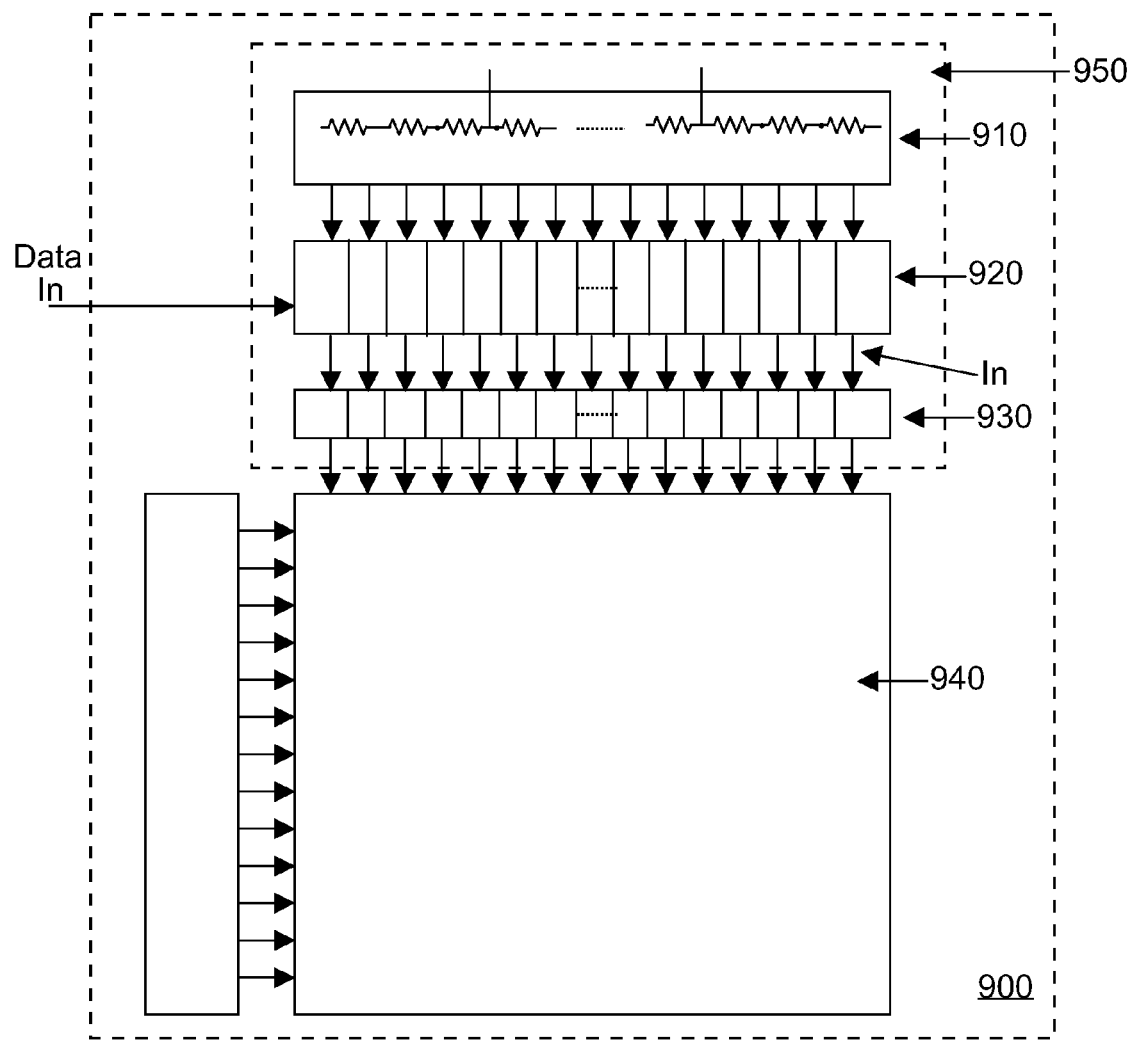
FIG. 9 is a conceptual diagram of a drive device equipped with a drive circuit of the present invention.

A drive circuit of a liquid crystal display, according to a first embodiment of the present invention will first be described using FIGS. 1, 2 and 9. FIG. 1 is a circuit diagram of the drive circuit 100 according to the first embodiment of the present invention. As shown in the drawings, the drive circuit 100 includes an amplifier (OPAMP) 10, a transistor MP-SW1, a trnasistor MN-DIS and a transistor MN-SW1 as minimum constituent elements. The OPAMP 10 has an inversion input, a non-inversion input and an output as minimum constituent elements. The OPAMP 10 has the inversion input and the output connected to each other and takes a connection called generally "voltage follower". An input signal IN is inputted to the non-inversion input of the OPAMP 10. As shown in FIG. 9, the input signal IN is a voltage obtained by selecting each gradation voltage corresponding to input data from a gradation voltage generating circuit 910 by a digital/analog converter 920. The output of the drive circuit 930 corresponds to each gradation voltage supplied to a liquid crystal panel 940. The output of the OPAMP 10 is supplied to an output pad PAD of a driver IC as an output signal OUT of the drive circuit 100 and finally supplied to a load capacitor CLOAD of the liquid crystal panel 940 equipped with the driver IC 950.

The transistor MP-SW1 used as a first PMOS transistor has a gate to which the input signal IN is applied, a source connected to the output of the OPAMP 10 and a drain connected to a node NGATE. The transistor MP-SW1 compares the potential of the source and the potential of the gate and is turned on when the gate potential is lowered to a threshold value or more from the source potential.

The transistor MN-DIS used as a first NMOS transistor has a gate connected to the node NGATE, a source connected to a ground GND and a drain connected to the output of the OPAMP 10.

The transistor MN-SW1 used as a second NMOS transistor has a gate to which a predetermined constant voltage VBL is applied, a drain connected to the node NGATE, and a source connected to the ground GND. Here, the predetermined constant voltage VBL is a voltage greater than or equal to a threshold voltage of the transistor MN-SW1. As one example, VDDH and VBL can be set to 15V and 1.1V respectively. Thus, when the drive circuit is supplied with power, the transistor MN-SW1 is of a transistor that is always brought to an on state and operated substantially in the form of a constant current.

The operation of the drive circuit will be explained below using FIG. 2. FIG. 2 is a timing chart of the drive circuit 100. VIN indicates a change in the voltage of the input signal IN. VIN represents that it has changed from a potential higher than a common potential Vcom to a potential lower than it at a time t1. With the change in VIN at the time t1, a difference in potential occurs between the input signal IN and the output signal OUT. The transistor MP-SW1 is turned on in response to a change in input signal IN (where the change in input signal is greater than or equal to the threshold value of the transistor MP-SW1). When the transistor MP-SW1 is turned on, current flows through the transistor MP-SW1 so that the node NGATE approaches VOUT set prior to the time t1. With a rise in the potential of the node NGATE, the transistor MN-DIS is turned on. When the difference in potential between the input signal IN and the output signal OUT is large, the transistor MN-DIS is turned on deep. When the transistor MN-DIS is turned on, the electric charge of the load capacitor CLOAD of the liquid crystal panel is abruptly discharged. When the load capacitor CLOAD is sufficiently discharged, the difference in potential between the input signal IN and the output signal OUT becomes smaller, so that the transistor MP-SW1 is gently turned off. As a result, the node NGATE gradually approaches a ground level, and the transistor MN-DIS is gradually turned off, whereby the discharge of the load capacitor CLOAD is terminated.

According to the first embodiment of the present invention, it is possible to allow the output potential to quickly follow the potential of the input signal IN, using the difference in potential between the input signal IN and the output signal OUT, which is developed upon switching of the input signal IN. Particularly since the configuration of the first embodiment using the difference in potential between the input signal IN and the output signal OUT requires no external control signal, there is no need to provide a control circuit such as a dedicated timing controller. It is thus possible to reduce cost taken for the development of the control circuit.

Further, a circuit area can be reduced by the control circuit. Since the transistor MN-DIS is turned on/off according to the difference in potential between the input signal IN and the output signal OUT, the gentle operation can be realized on the falling edge of the potential of the output signal OUT. With the gentle off operation of the transistor MN-DIS, the possibility that switching noise or the like will occur in the signal output OUT can be reduced. Further, the adoption of the first embodiment of the present invention makes it possible to enhance drive capacity without increasing the steady-state current of the OPAMP 10, and enables a reduction in heat generation of the driver IC. Even when it is necessary to allow current to flow into the output on a stationary basis, there is no need to increase the size of the output-stage transistor of the OPAMP 10, and a mere increase in the size of the transistor MN-DIS adopted in the first embodiment of the present invention can cope with it, thus making it possible to suppress an increase in the steady-state current in the OPAMP.

Second Preferred Embodiment

Figure 3:
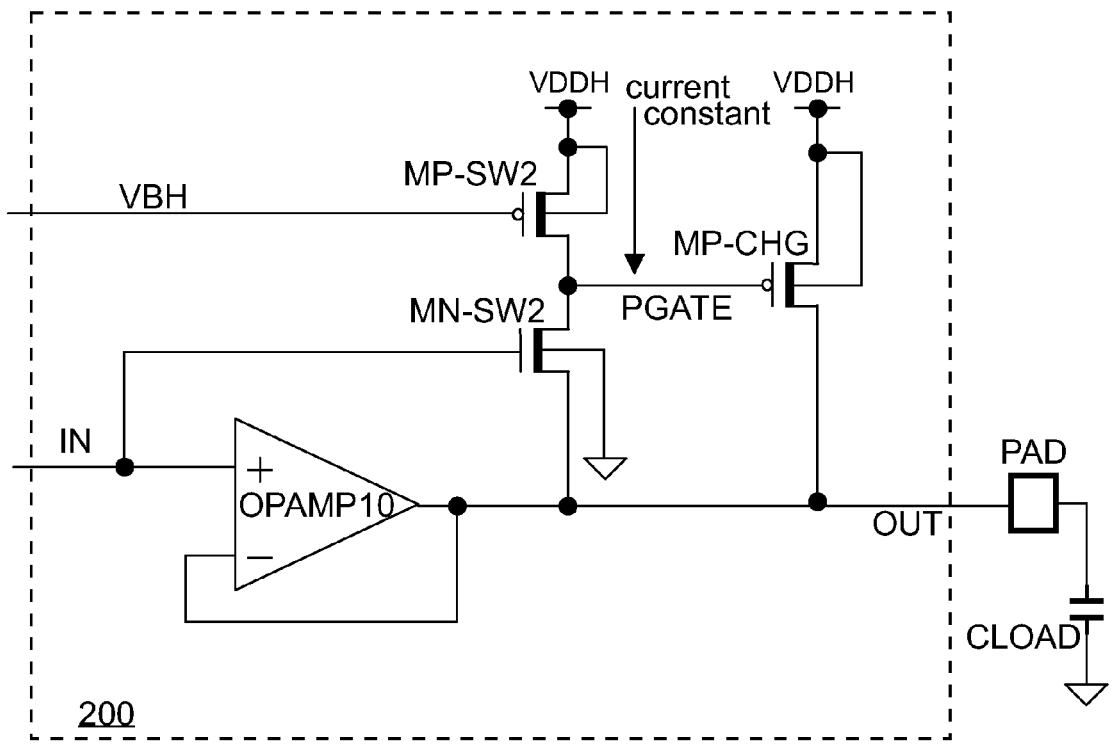
FIG. 3 illustrates a drive circuit according to a second embodiment of the present invention.
Figure 4:
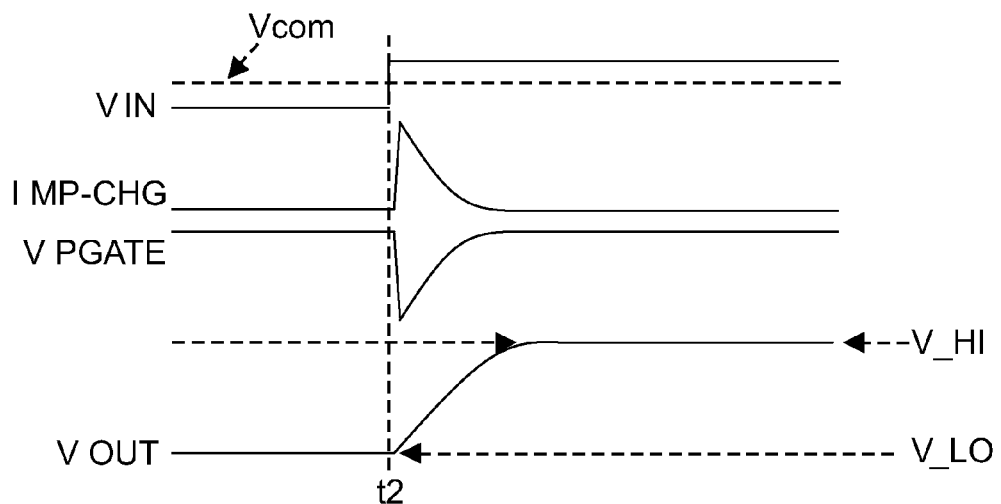
FIG. 4 is a timing chart of the drive circuit shown in FIG. 3.

A drive circuit of a liquid crystal display, according to a second embodiment of the present invention will be explained using FIGS. 3 and 4. FIG. 3 is a circuit diagram of the drive circuit 200 according to the second embodiment of the present invention. The same constituent elements as those in the first embodiment are respectively given the same reference numerals, and their explanations will be omitted.

The drive circuit 200 includes an amplifier (OPAMP) 10, a transistor MN-SW2, a trnasistor MP-CHG and a transistor MP-SW2 as minimum constituent elements. The OPAMP 10 has an inversion input and an output connected to each other. An input signal IN is inputted to the non-inversion input of the OPAMP 10. The output of the OPAMP 10 is supplied to an output pad PAD of a driver IC as an output signal OUT of the drive circuit 200 and finally supplied to a load capacitor CLOAD of a liquid crystal panel equipped with a driver IC.

The transistor MN-SW2 used as a third PMOS transistor has a gate to which the input signal IN is applied, a source connected to the output of the OPAMP 10 and a drain connected to a node PGATE. The transistor MN-SW2 compares the potential of the source and the potential of the gate and is turned on when the gate potential is raised to a threshold value or more from the source potential. The transistor MP-CHG used as a second PMOS transistor has a gate connected to the node PGATE, a source connected to a source potential VDDH and a drain connected to the output of the OPAMP 10.

The transistor MP-SW2 used as a third PMOS transistor has a gate to which a predetermined constant voltage VBH is applied, a drain connected to the node PGATE, and a source connected to a source potential VDDH. Here, the predetermined constant voltage VBH is a voltage less than or equal to a threshold voltage of the transistor MP-SW2. As one example, VDDH and VBH can be set to 15V and 13.8V respectively. Thus, when the drive circuit is supplied with power, the transistor MP-SW2 is of a transistor that is always brought to an on state and operated substantially in the form of a constant current.

The operation of the drive circuit will be explained below using FIG. 4. FIG. 4 is a timing chart of the drive circuit 200. VIN indicates a change in the voltage of the input signal IN. VIN represents that the voltage of the input signal IN has changed from a potential lower than a common potential Vcom to a potential higher than it at a time t2. With the change in VIN at the time t2, a difference in potential occurs between the input signal IN and the output signal OUT. The transistor MN-SW2 is turned on in response to a change in input signal IN (where the change in input signal is greater than or equal to the threshold value of the transistor MN-SW2). When the transistor MN-SW2 is turned on, current flows through the transistor MN-SW2 so that the node PGATE approaches VOUT set prior to the time t2. With a drop in the potential of the node PGATE, the transistor MP-CHG is turned on. When the difference in potential between the input signal IN and the output signal OUT is large, the transistor MP-CHG is turned on deep. When the transistor MP-CHG is turned on, the electric charge of the load capacitor CLOAD of the liquid crystal panel is abruptly charged. When the load capacitor CLOAD is sufficiently charged, the difference in potential between the input signal IN and the output signal OUT becomes smaller, so that the transistor MN-SW2 is gently turned off. As a result, the node PGATE gradually approaches the source potential VDDH, and the transistor MP-CHG is gradually turned off, whereby the charge of the load capacitor CLOAD is terminated.

According to the second embodiment of the present invention, it is possible to allow the potential of the output signal OUT to quickly follow the potential of the input signal IN, using the difference in potential between the input signal IN and the output signal OUT, which is developed upon switching of the input signal IN. Particularly since the configuration of the second embodiment using the difference in potential between the input signal IN and the output signal OUT requires no external control signal, there is no need to provide a control circuit such as a dedicated timing controller. It is thus possible to reduce cost taken for the development of the control circuit. Further, a circuit area can be reduced by the control circuit. Since the transistor MP-CHG is turned on/off according to the difference in potential between the input signal IN and the output signal OUT, the gentle operation can be realized on the rising edge of the potential of the output signal OUT. With the gentle off operation of the transistor MP-CHG, the possibility that switching noise or the like will occur in the signal output OUT can be reduced. Further, the adoption of the second embodiment of the present invention makes it possible to enhance drive capacity without increasing the steady-state current of the OPAMP 10, and enables a reduction in heat generation of the driver IC. Even when it is necessary to allow current to flow into the output on a stationary basis, there is no need to increase the size of the output-stage transistor of the OPAMP 10, and a mere increase in the size of the transistor MP-CHG adopted in the first embodiment of the present invention can cope with it, thus making it possible to suppress an increase in the steady-state current in the OPAMP.

Third Preferred Embodiment

Figure 5:
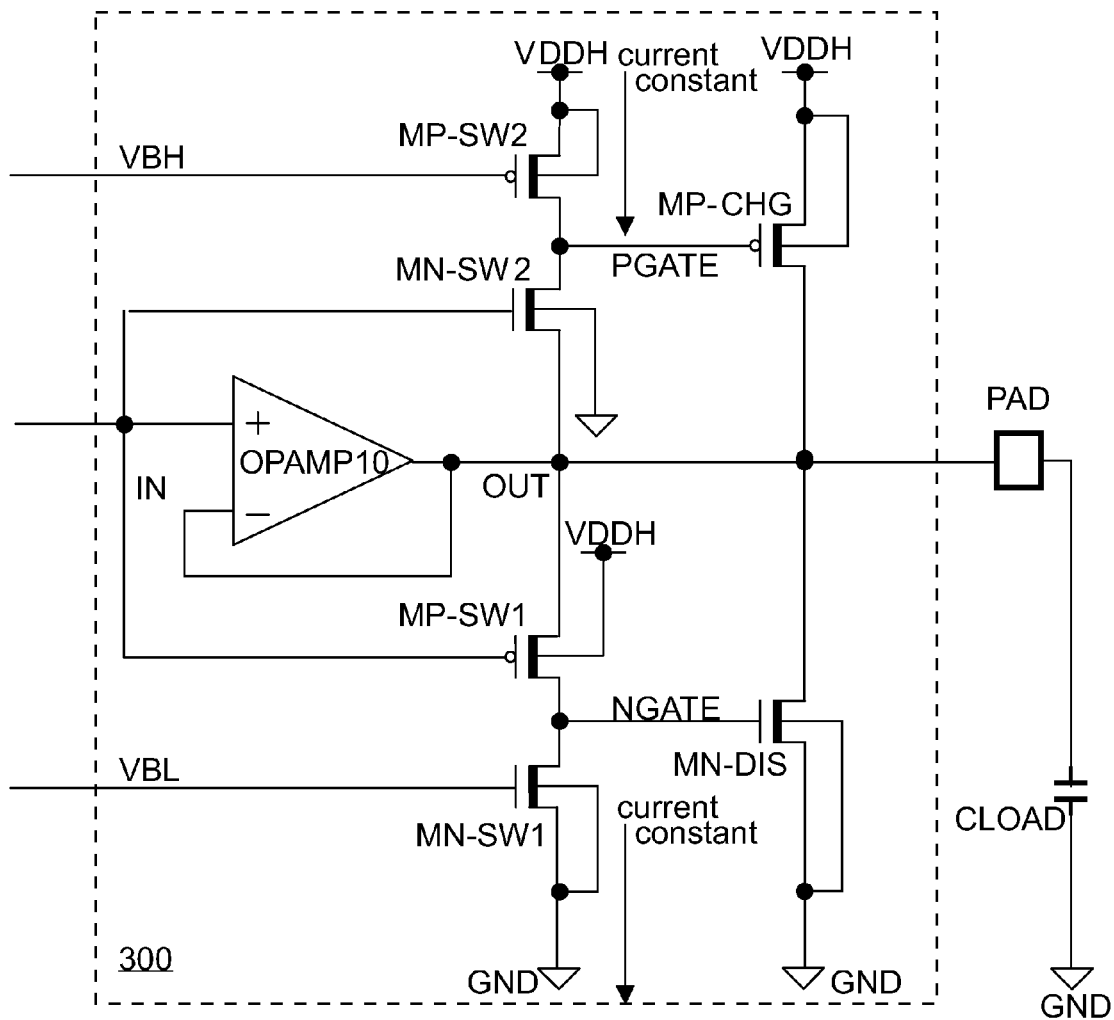
FIG. 5 depicts a drive circuit according to a third embodiment of the present invention.
Figure 6:
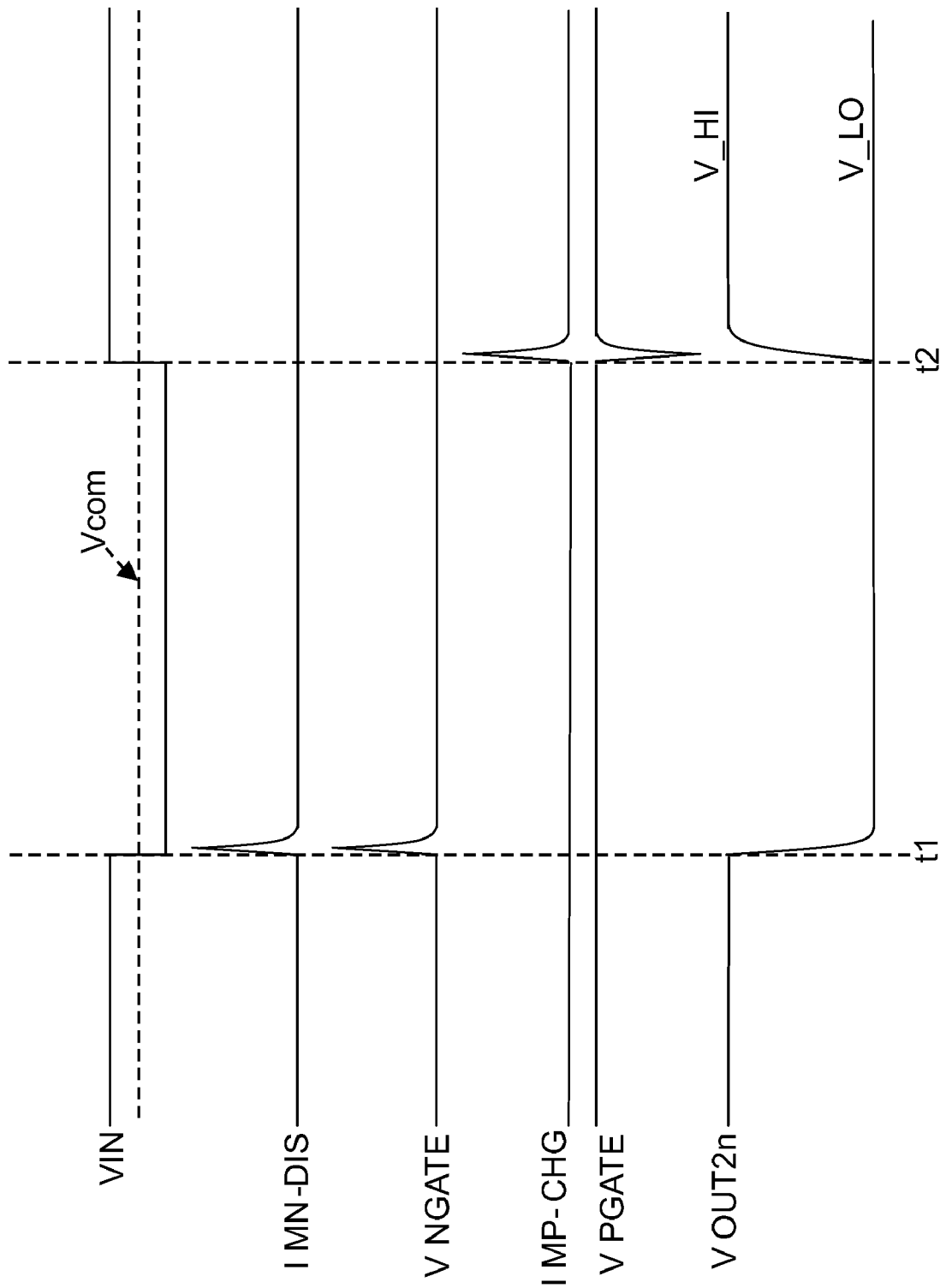
FIG. 6 is a timing chart of the drive circuit shown in FIG. 5.

A drive circuit of a liquid crystal display, according to a third embodiment of the present invention will be explained using FIGS. 5 and 6. FIG. 5 is a circuit diagram of the drive circuit 300 according to the third embodiment of the present invention. The drive circuit 300 is a drive circuit that combines the configuration of the drive circuit according to the first embodiment with the configuration of the drive circuit according to the second embodiment. The drive circuit 300 includes an amplifier (OPAMP) 10, a transistor MP-SW1, a trnasistor MN-DIS, a transistor MN-SW1, a transistor MN-SW2, a transistor MP-CHG and a transistor MP-SW2 as minimum constituent elements. The OPAMP 10 has an inversion input and an output connected to each other and takes a connection called generally "voltage follower". An input signal IN is inputted to a non-inversion input of the OPAMP 10. As shown in FIG. 9, the input signal IN is an output of a digital/analog converter connected to a previous stage. A gradation voltage supplied to a liquid crystal panel is applied therefor. The output of the OPAMP 10 is supplied to its corresponding output pad PAD of a driver IC as an output signal OUT of the drive circuit 300 and finally supplied to a load capacitor CLOAD of the liquid crystal panel equipped with the driver IC.

The transistor MP-SW1 used as a first PMOS transistor has a gate to which the input signal IN is applied, a source connected to the output of the OPAMP 10 and a drain connected to a node NGATE. The transistor MP-SW1 compares the potential of the source and the potential of the gate and is turned on when the gate potential is lowered to a threshold value or more from the source potential.

The transistor MN-DIS used as a first NMOS transistor has a gate connected to the node NGATE, a source connected to a ground GND and a drain connected to the output of the OPAMP 10.

The transistor MN-SW1 used as a second NMOS transistor has a gate to which a predetermined constant voltage VBL is applied, a drain connected to the node NGATE, and a source connected to the ground GND. Here, the predetermined constant voltage VBL is a voltage greater than or equal to a threshold voltage of the transistor MN-SW1. As one example, VDDH and VBL can be set to 15V and 1.1V respectively. Thus, when the drive circuit is supplied with power, the transistor MN-SW1 is of a transistor that is always brought to an on state and operated substantially in the form of a constant current.

The transistor MN-SW2 used as a third PMOS transistor has a gate to which the input signal IN is applied, a source connected to the output of the OPAMP 10 and a drain connected to a node PGATE. The transistor MN-SW2 compares the potential of the source and the potential of the gate and is turned on when the gate potential is increased to a threshold value or more from the source potential.

The transistor MP-CHG used as a second PMOS transistor has a gate connected to the node PGATE, a source connected to the source potential VDDH and a drain connected to the output of the OPAMP 10.

The transistor MP-SW2 used as the third PMOS transistor has a gate to which a predetermined constant voltage VBH is applied, a drain connected to the node PGATE, and a source connected to the source potential VDDH. Here, the predetermined constant voltage VBH is a voltage less than or equal to a threshold voltage of the transistor MP-SW2. As one example, VDDH and VBH can be set to 15V and 13.8V respectively. Thus, when the drive circuit is supplied with power, the transistor MP-SW2 is of a transistor that is always brought to an on state and operated substantially in the form of a constant current.

The operation of the drive circuit will be explained below using FIG. 6. FIG. 6 is a timing chart of the drive circuit 300. VIN indicates a change in the voltage of the input signal IN. VIN represents that the voltage of the input signal IN has changed from a potential higher than a common potential Vcom to a potential lower than it at a time t1 and has changed from the potential lower than the common potential Vcom to the potential higher than it at a time t2. With the change in VIN from the potential higher than the common potential Vcom to the potential lower that it at the time t1, a difference in potential occurs between the input signal IN and the output signal OUT. The transistor MP-SW1 is turned on in response to a change in input signal IN (where the change in input signal is greater than or equal to the threshold value of the transistor MP-SW1). When the transistor MP-SW1 is turned on, current flows through the transistor MP-SW1 so that the node NGATE approaches VOUT set prior to the time t1. With a rise in the potential of the node NGATE, the transistor MN-DIS is turned on. When the difference in potential between the input signal IN and the output signal OUT is large, the transistor MN-DIS is turned on deep. When the transistor MN-DIS is turned on, the electric charge of the load capacitor CLOAD of the liquid crystal panel is abruptly discharged. When the load capacitor CLOAD is sufficiently discharged, the difference in potential between the input signal IN and the output signal OUT becomes smaller, so that the transistor MP-SW1 is gently turned off. As a result, the node NGATE gradually approaches a ground level, and the transistor MN-DIS is gradually turned off, whereby the discharge of the load capacitor CLOAD is terminated.

When VIN changes fro the potential lower than the common potential Vcom to the potential higher than it at the time t2, a difference in potential occurs between the input signal IN and the output signal OUT. The transistor MN-SW2 is turned on in repose to the change in the input signal IN (where the change in input signal is greater than or equal to the threshold value of the transistor MN-SW2). When the transistor MN-SW2 is turned on, current flows through the transistor MN-SW2 so that the node PGATE approaches VOUT set prior to the time t2. With a drop in the potential of the node PGATE, the transistor MP-CHG is turned on. When the difference in potential between the input signal IN and the output signal OUT is large, the transistor MP-CHG is turned on deep. When the transistor MP-CHG is turned on, the electric charge of the load capacitor CLOAD of the liquid crystal panel is abruptly charged. When the load capacitor CLOAD is sufficiently charged, the difference in potential between the input signal IN and the output signal OUT becomes smaller, so that the transistor MN-SW2 is gently turned off. As a result, the node PGATE gradually approaches the source potential VDDH, and the transistor MP-CHG is gradually turned off, whereby the charge of the load capacitor CLOAD is terminated.

With the above operation, according to the third embodiment of the present invention, a drive circuit corresponding to an OPAMP 10 having a rail to rail operation can be realized in addition to the advantageous effects of the first and second embodiments.

Fourth Preferred Embodiment

Figure 7:
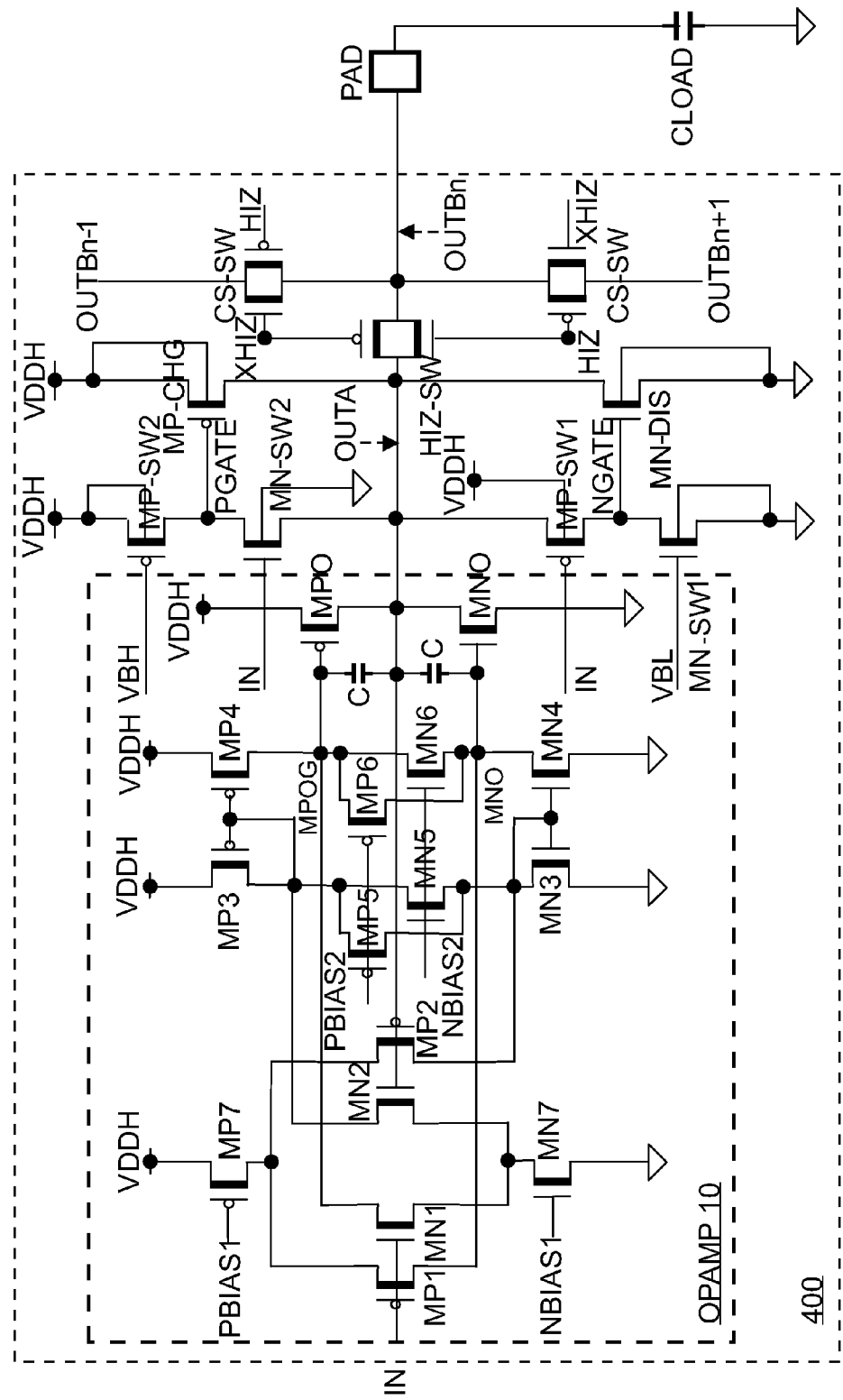
FIG. 7 shows a drive circuit according to a fourth embodiment of the present invention.
Figure 8:
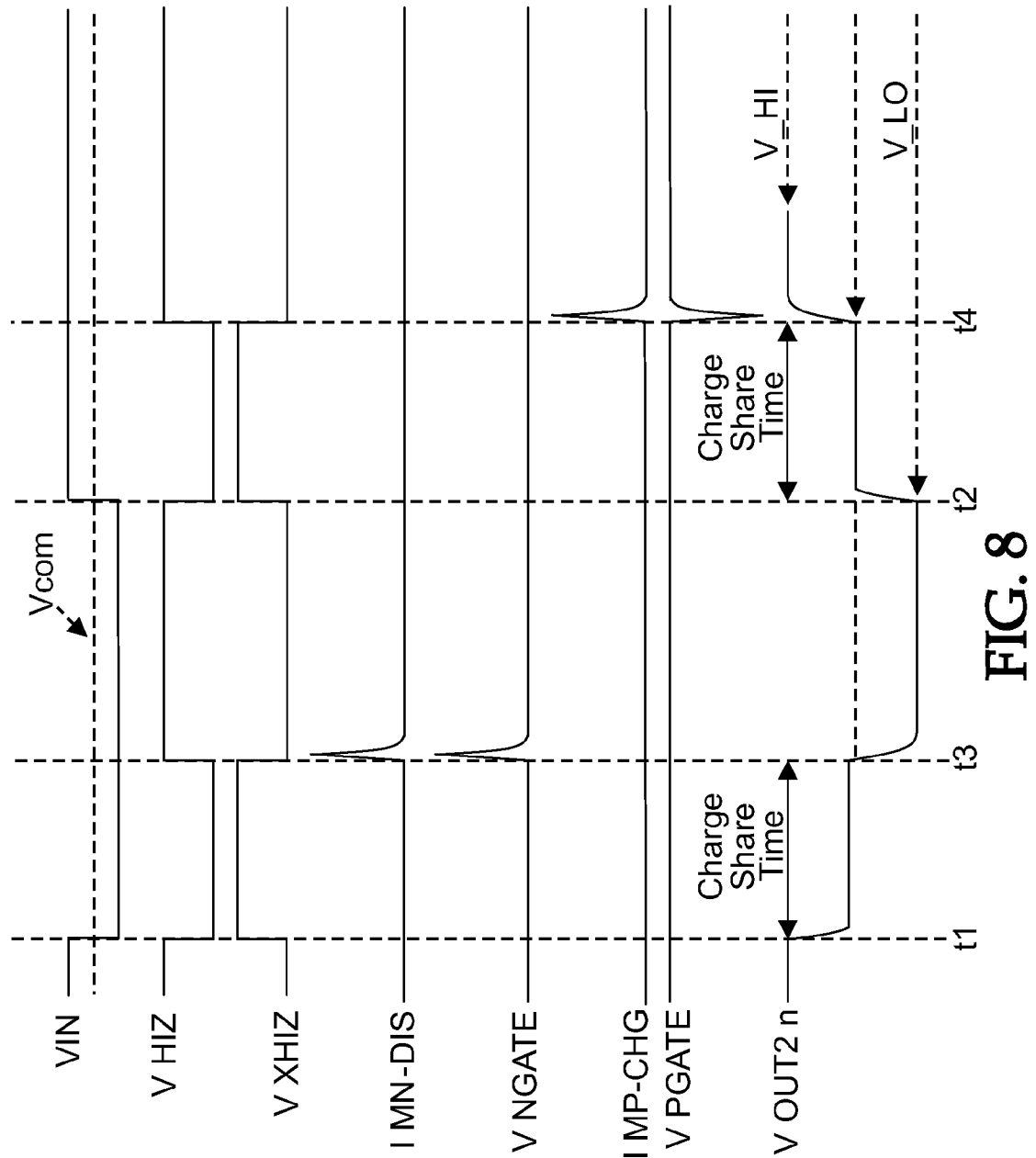
FIG. 8 is a timing chart of the drive circuit shown in FIG. 7.

A drive circuit of a liquid crystal display, according to a fourth embodiment of the present invention will be explained using FIGS. 7 and 8. FIG. 7 is a circuit diagram of the drive circuit 400 according to the fourth embodiment of the present invention. The same constituent elements as those in the third embodiment are given the same reference numeral respectively, and their explanations will be omitted. Incidentally, since a general amplifier is represented in a circuit level although an amplifier 10 is shown in a detailed circuit diagram in FIG. 7, the detailed description of operation thereof is omitted.

The feature of the fourth embodiment is that the drive circuit has first switch means HIZ-SW and second switch means CS-SW in addition to the amplifier (OPAMP) 10, transistor MP-SW1, transistor MN-DIS, transistor MN-SW1, transistor MN-SW2, transistor MP-CHG and transistor MP-SW2 described in the third embodiment. The first switch means HIZ-SW is connected between a node OUTA to which the drain of the transistor MP-CHG and the drain of the transistor MN-DIS are connected, and an output pad PAD. The first switch means HIZ-SW is a transfer gate, for example.

The second switch means CS-SW is connected between a node OUTBn provided between the first switch means HIZ-SW and the output pad PAD, and its adjacent output node OUTBn-1 of the drive circuit. The second switch means CS-SW is constituted of, for example, a transfer gate.

The operation of the drive circuit will next be explained using FIG. 8. FIG. 8 is a timing chart of the drive circuit 400. VIN represents that the potential has changed from a potential higher than a common potential Vcom to a potential lower than it at a time t1 and has changed from the potential lower than the common potential Vcom to the potential high than it at a time t2. VHIZ falls from a high potential to a low potential at the times t1 and t2 and rises from the low potential to the high potential at times t3 and t4. VXHIZ rises from a low potential to a high potential at the times t1 and t2 and falls from the high potential to the low potential at the times t3 and t4. VHIZ and VXHIZ are complementary signals.

With the changes in the signals of VHIZ and VXHIZ, the first switch means HIZ-SW is turned off and the second switch means CS-SW are turned on at the times t1 and t2 respectively. With the turning on of the second switch means CS-SW, their corresponding outputs OUTBn of the drive circuit are short-circuited. With the short-circuiting of their corresponding outputs OUTBn of the drive circuit, the potentials of the respective outputs OUTBn of the drive circuit are averaged, thus resulting in a potential close to the common potential Vcom. At the time t3, the second switch means CS-SW are turned off and the first switch means HIZ-SW is turned on. When the first switch means HIZ-SW is turned on in a state in which each output OUTBn of the drive circuit is brought close to the common potential Vcom, a difference in potential occurs between the input signal IN and the output signal OUTA.

The transistor MP-SW1 is turned on in response to the occurrence of the difference in potential between the input signal IN and the output signal OUTA (where the difference in potential between the input signal IN and the output signal OUTA is greater than or equal to the threshold value of the transistor MP-SW1). With the turning on of the transistor MP-SW1, current flows through the transistor MP-SW1 so that a node NGATE approaches the common potential Vcom. With a rise in the potential of the node NGATE, the transistor MN-DIS is turned on. When the difference in potential between the input signal IN and the output signal OUTA is large, the transistor MN-DIS is turned on deep. When the transistor MN-DIS is turned on, the electric charge of a load capacitor CLOAD of a liquid crystal panel is abruptly discharged. When the load capacitor CLOAD is sufficiently discharged, the difference in potential between the input signal IN and the output signal OUTA becomes smaller, so that the transistor MP-SW1 is gently turned off. As a result, the node NGATE gradually approaches a ground level, and the transistor MN-DIS is gradually turned off, whereby the discharge of the load capacitor CLOAD is terminated.

At the time t4, the second switch means CS-SW are turned and the first switch means HIZ-SW is turned on. When the first switch means HIZ-SW is turned on in a state in which the output OUTBn of the drive circuit is brought close to the common potential Vcom, a difference in potential occurs between the input signal IN and the output signal OUTA.

The transistor MN-SW2 is turned on in response to the occurrence of the difference in potential between the input signal IN and the output signal OUTA (where the difference in potential between the input signal IN and the output signal OUTA is greater than or equal to the threshold value of the transistor MN-SW2). With the turning on of the transistor MN-SW2, current flows through the transistor MN-SW2 so that a node PGATE approaches the common potential Vcom. With a drop in the potential of the node PGATE, the transistor MP-CHG is turned on. When the difference in potential between the input signal IN and the output signal OUTA is large, the transistor MP-CHG is turned on deep. When the transistor MP-CHG is turned on, the electric charge of the load capacitor CLOAD of the liquid crystal panel is abruptly charged. When the load capacitor CLOAD is sufficiently charged, the difference in potential between the input signal IN and the output signal OUTA becomes smaller, so that the transistor MN-SW2 is gently turned off. As a result, the node PGATE gradually approaches a source potential VDDH, and the transistor MP-CHG is gradually turned off, whereby the charge of the load capacitor CLOAD is terminated.

According to the fourth embodiment of the present invention as descried above, the provision of the periods for short-circuiting the respective outputs OUTBn of the drive circuit makes it possible to reduce the driving period of the OPAMP 10 and cut down power consumption.

If the basic configuration of the present invention is taken, then the difference in potential occurs between the input signal IN and the output signal OUTA by short-circuiting the respective outputs OUTBn of the drive circuit. As a result, there is a fear that the transistor MP-SW1 or the transistor MN-SW2 will be turned on. According to the fourth embodiment, however, a malfunction can easily be prevented by controlling the first switch means HIZ-SW using the signals for controlling the second switch means CS-SW for short-circuiting the respective outputs OUTBn of the drive circuit.

Preferred Modifications

Figure 10:
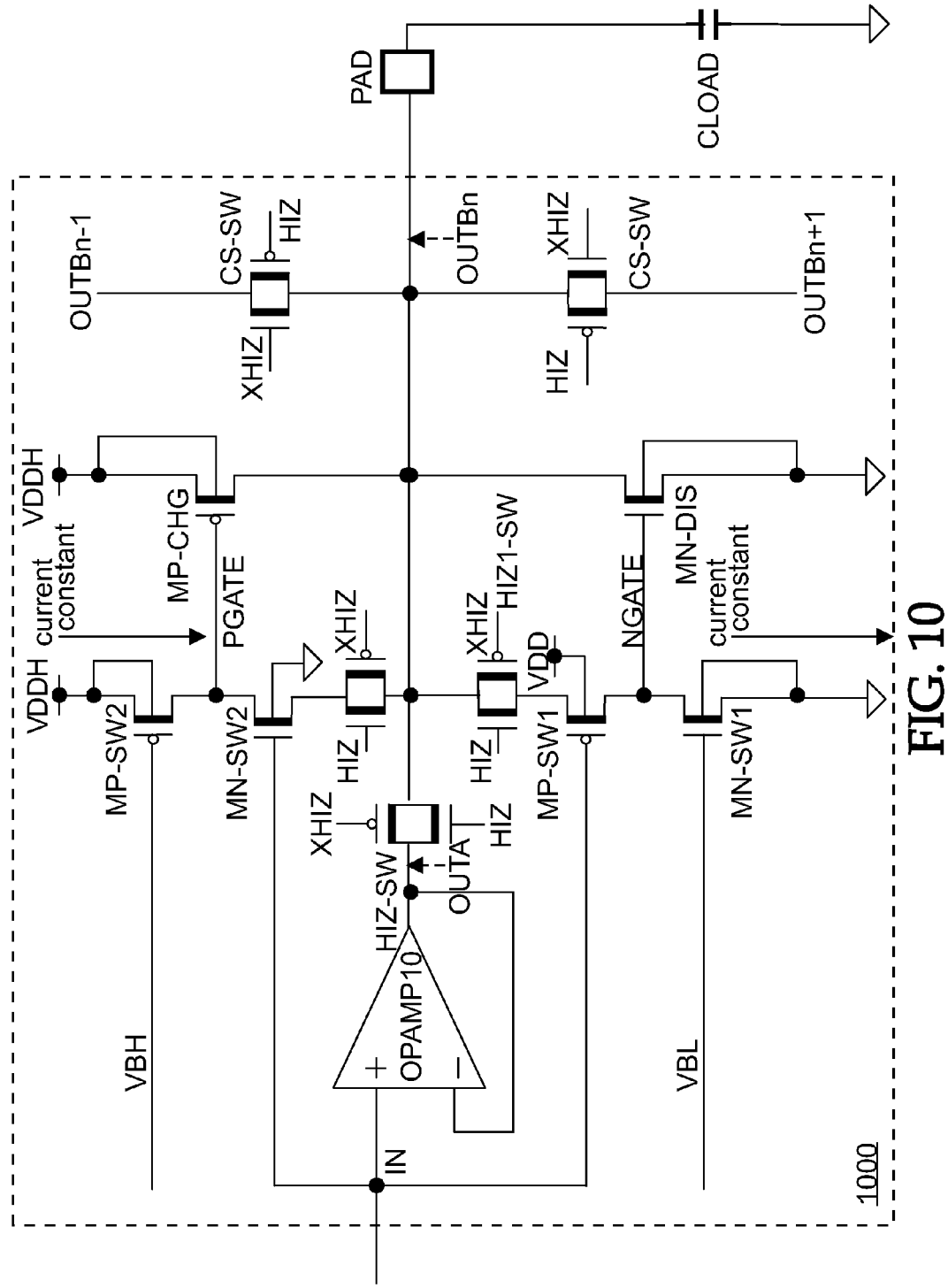
FIG. 10 shows a modification 1 of the fourth embodiment of the present invention.

FIG. 10 shows a drive circuit 1000 illustrative of a modification 1 of the fourth embodiment. Different points between the modification 1 and the fourth embodiment will be explained. In the drive circuit 1000, third switch means HIZ1-SW is provided between a node OUTBn located between first switch means HIZ-SW and an output pad PAD and the source of MP-SW1. Further, fourth switch means HIZ2-SW is provided between the node OUTBn located between the first switch means HIZ-SW and the output pad PAD and the source of MN-SW2. The drain of a transistor MN-DIS and the drain of a transistor MP-CHG are connected to the output node OUTBn.

Since the first switch means HIZ-SW, the third switch means HIZ1-SW and the fourth switch means HIZ2-SW are controlled by the same control signals HIZ and XHIZ, they perform the same on/off operation. The operation of the drive circuit is identical to that of the fourth embodiment.

Although the relationship of connections between the transistor MP-SW1, transistor MN-SW2, transistor MN-DIS and transistor MP-CHG vary differently from the fourth embodiment, it is possible to operate the drive circuit without any malfunction in a manner similar to the fourth embodiment.

Figure 11:
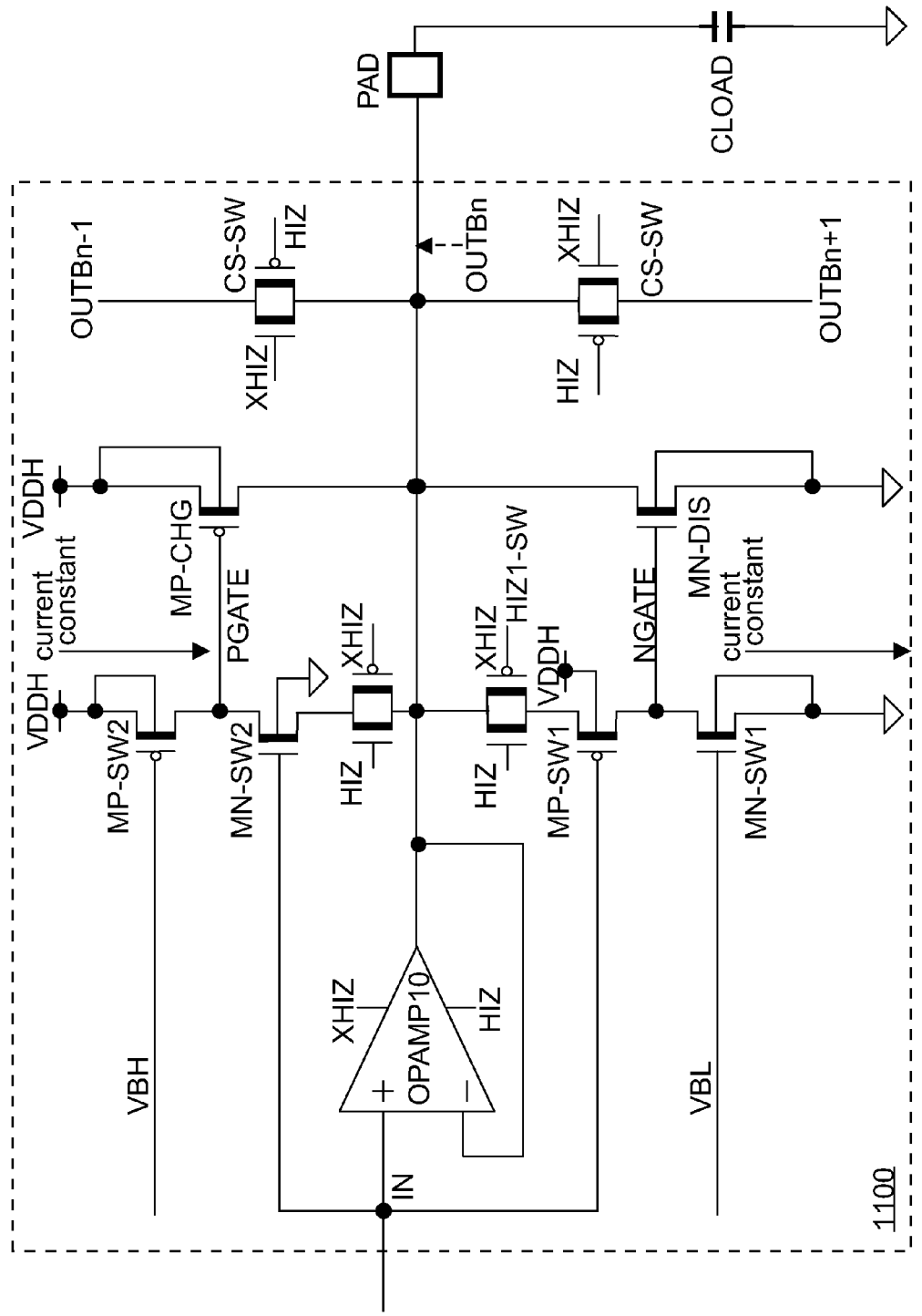
FIG. 11 shows a modification 2 of the fourth embodiment of the present invention.

FIG. 11 shows a drive circuit 1100 illustrative of a modification 2 of the fourth embodiment. Different points between the modification 2 and the modification 1 of the fourth embodiment will be explained. In the drive circuit 1100, the first switch means HIZ-SW is omitted as compared with the modification 1. An OPAMP 10 is multifunctioned. The OPAMP 10 shown in FIG. 11 is inputted with two control signals in addition to an inversion input, a non-inversion input and an output. The control signals are respectively a control signal HIZ and a control signal XHIZ corresponding to control signals for third switch means HIZ1-SW and fourth switch means HIZ2-SW. When the control signal HIZ is high, the OPAMP 10 outputs an output signal OUTBn corresponding to an input signal IN in sync with the control signal HIZ. When the control signal HIZ is low, switch means built in the OPAMP 10 cuts off the connection between the input signal IN and the output signal OUTBn. Although the OPAMP 10 is inputted with the two control signals, at least one may be inputted thereto. As in the present modification 2, the two control signals may be generated within the OPAMP 10 from one control signal. Incidentally, the operation of the drive circuit is the same as that of the fourth embodiment.

The medication 2 can be operated without any malfunction in a manner similar to the modification 1. It is possible to provide a drive circuit adapted even to a multifunctioned OPAMP.

While the preferred forms of the present invention have been described, it is to be understood that modifications will be apparent to those skilled in the art without departing from the spirit of the invention. The scope of the invention is to be determined solely by the following claims.

What is claimed is:

1. A drive circuit suitable for use in a liquid crystal display, comprising:
   an op amp which has an inversion input, a non-inversion input and a first output and of which the inversion input and the first output are connected to each other;
   a first PMOS transistor having a gate to which a node for the non-inversion input of the op amp is connected, and a source to which a node for the output of the op amp is connected;
   a first NMOS transistor having a gate to which a drain of the first PMOS transistor is connected, a drain to which the node for the output of the op amp is connected, and a source connected to ground; and
   a second NMOS transistor having a gate supplied with a predetermined first voltage, a drain to which the drain of the first PMOS transistor is connected, and a source connected to ground.

2. The drive circuit according to claim 1, further including:
   a third NMOS transistor having a gate to which the node for the non-inversion input of the op amp is connected, and a source to which the node for the output of the op amp is connected;
   a second PMOS transistor having a gate to which a drain of the third NMOS transistor is connected, a drain to which the node for the output of the op amp is connected, and a source connected to a power supply; and
   a third PMOS transistor having a gate supplied with a predetermined second voltage, a drain to which the drain of the third NMOS transistor is connected, and a source connected to the power supply.

3. A drive circuit suitable for use in a liquid crystal display, comprising:
   an op amp which has an inversion input, a non-inversion input and a first output and of which the inversion input and the first output are connected to each other;
   a first PMOS transistor turned on/off by detecting a difference in potential between the first output of the op amp and the non-inversion input thereof;
   a first NMOS transistor turned on/off according to the turning on/off of the first PMOS transistor and operated so as to cancel out the difference in potential between the first output and the non-inversion input; and
   a second NMOS transistor which is connected in series between the first PMOS transistor and ground and has a gate supplied with a voltage greater than or equal to a threshold value thereof.

4. The drive circuit according to claim 3, further including:
   a third NMOS transistor turned on/off by detecting the difference in potential between the first output of the op amp and the non-inversion input thereof;

a second PMOS transistor turned on/off according to the turning on/off of the third NMOS transistor and operated so as to cancel out the difference in potential between the first output and the non-inversion input; and a third PMOS transistor which is connected in series between the third NMOS transistor and a power supply and has a gate supplied with a voltage less than or equal to a threshold value thereof.

5. A drive circuit suitable for use in a liquid crystal display, comprising:

an op amp which has an inversion input, a non-inversion input and a first output and of which the inversion input and the first output are connected to each other;

a third NMOS transistor having a gate to which a node for the non-inversion input of the op amp is connected, and a source to which a node for the output of the op amp is connected;

a second PMOS transistor having a gate to which a drain of the third NMOS transistor is connected, a drain to which the node for the output of the op amp is connected, and a source connected to a power supply; and a third PMOS transistor having a gate supplied with a predetermined second voltage, a drain to which the drain of the third NMOS transistor is connected, and a source connected to the power supply.

6. A drive circuit suitable for use in a liquid crystal display, comprising:

an op amp which has an inversion input, a non-inversion input and a first output and of which the inversion input and the first output are connected to each other;

a third NMOS transistor turned on/off by detecting a difference in potential between the first output of the op amp and the non-inversion input thereof;

a second PMOS transistor turned on/off according to the turning on/off of the third NMOS transistor and operated so as to cancel out the difference in potential between the first output and the non-inversion input; and a third PMOS transistor which is connected in series between the third NMOS transistor and a power supply and has a gate supplied with a voltage less than or equal to a threshold value thereof.

7. A drive device suitable for use in a liquid crystal display, including a plurality of drive circuits each comprising:

an op amp which has an inversion input, a non-inversion input and a first output and of which the inversion input and the first output are connected to each other;

a first PMOS transistor having a gate to which a node for the non-inversion input of the op amp is connected, and a source to which a node for the output of the op amp is connected;

a first NMOS transistor having a gate to which a drain of the first PMOS transistor is connected, a drain to which the node for the output of the op amp is connected, and a source connected to ground;

a second NMOS transistor having a gate supplied with a predetermined first voltage, a drain to which the drain of the first PMOS transistor is connected, and a source connected to ground;

a third NMOS transistor having a gate to which the node for the non-inversion input of the op amp is connected, and a source to which the node for the output of the op amp is connected;

a second PMOS transistor having a gate to which a drain of the third NMOS transistor is connected, a drain to which the node for the output of the op amp is connected, and a source connected to a power supply; and a third PMOS transistor having a gate supplied with a predetermined second voltage, a drain to which the drain of the third NMOS transistor is connected, and a source connected to the power supply, wherein the drive device has output pads corresponding to the drive circuits respectively, and wherein each of the drive circuits includes first switch means provided between the node for the output of the op amp and the corresponding output pad, and second switch means provided between nodes lying between the first switch means of the drive circuit and the output pad.

8. A drive circuit suitable for use in a liquid crystal display, comprising:

an op amp which has an inversion input, a non-inversion input, a first output and a control terminal and of which the inversion input and the first output are connected to each other, and which switches, according to a control signal inputted to the control terminal, whether an output corresponding to the non-inversion input is outputted/non-outputted to the first output;

third switch means connected to an output node of the op amp and turned on/off by the control signal;

fourth switch means connected to the output node of the op amp and turned on/off by the control signal;

a first PMOS transistor having a gate to which a node for the non-inversion input of the op amp is connected, and a source to which the output node of the op amp is connected via the third switch means;

a first NMOS transistor having a gate to which a drain of the first PMOS transistor is connected, a drain to which the output node of the op amp is connected, and a source connected to ground;

a second NMOS transistor having a gate supplied with a predetermined first voltage, a drain to which the drain of the first PMOS transistor is connected, and a source connected to ground;

a third NMOS transistor having a gate to which the node for the non-inversion input of the op amp is connected, and a source to which the output node of the op amp is connected via the fourth switch means;

a second PMOS transistor having a gate to which a drain of the third NMOS transistor is connected, a drain to which the output node of the op amp is connected, and a source connected to a power supply; and a third PMOS transistor having a gate supplied with a predetermined second voltage, a drain to which the drain of the third NMOS transistor is connected, and a source connected to the power supply.

9. A drive device suitable for use in a liquid crystal display, including a plurality of the drive circuits each defined as claimed in claim 8, wherein the drive device has output pads corresponding to the drive circuits respectively, and wherein each of the drive circuits includes first switch means provided between the node for the output of the op amp and the corresponding output pad, and second switch means provided between nodes lying between the first switch means of the drive circuit and the output pad.

10. A drive device suitable for use in a liquid crystal display, comprising:

a plurality of digital/analog converters each of which selects and outputs a predetermined analog voltage from a gradation voltage generating circuit according to input data; and a plurality of output circuits each of which inputs an output of said each digital/analog converter therein and outputs a drive voltage, wherein each of the output circuits has a first transistor which compares the output of the digital/analog converter and the output of the output circuit and is turned on when a predetermined different in potential occurs between the output of the digital/analog converter and the output of the output circuit, and a second transistor turned on so as to cause the output of the output circuit to approach the potential of the output of the digital/analog converter according to the first transistor.

* * * * *